(12) United States Patent
Zbinden

(10) Patent No.: US 11,543,444 B2
(45) Date of Patent: Jan. 3, 2023

(54) TENSION TRANSDUCING PASSIVE OPTICAL UTILITY POLE OVERTURNING SENSOR

(71) Applicant: Adam Jon Zbinden, Kirkland, WA (US)

(72) Inventor: Adam Jon Zbinden, Kirkland, WA (US)

( * ) Notice: Subject to any disclaimer, the term of this patent is extended or adjusted under 35 U.S.C. 154(b) by 83 days.

(21) Appl. No.: 17/086,435

(22) Filed: Nov. 1, 2020

(65) Prior Publication Data
US 2022/0137116 A1   May 5, 2022

(51) Int. Cl.
  *G01R 31/08*   (2020.01)
  *G01L 1/24*    (2006.01)
(52) U.S. Cl.
  CPC ............ *G01R 31/085* (2013.01); *G01L 1/242* (2013.01)
(58) Field of Classification Search
  CPC .............................. G01R 31/085; G01L 1/242
  See application file for complete search history.

(56) References Cited

U.S. PATENT DOCUMENTS

| | | | |
|---|---|---|---|
| 2011/0193698 A1* | 8/2011 | Somes | H02G 7/18 340/540 |
| 2011/0216479 A1* | 9/2011 | Holsomback | G01R 31/085 361/601 |
| 2017/0350932 A1* | 12/2017 | Wang | G01P 15/0891 |

* cited by examiner

*Primary Examiner* — Feba Pothen

(57) ABSTRACT

A tension transducer causes macro-bends in a single-mode fiber sensing line when a utility pole to which it is connected experiences an overturning moment. The device uses a trough shaped geometry to hold and support the single-mode sensing fiber, where an inelastically flexible hinge at the bottom, and a cinching mechanism at the top which connects to a pole mounting plate, combine to depress offset grooves on the inside of the trough walls into the fiber cable, to create a macro-bend in the single mode fiber which results in a detectable signal identifier on a time-domain laser reflectometry interrogation trace of the fiber sensor line. The device's connection to the pole mounting plate is designed to break away and disconnect at a tension value that would exceed the tensile strength of the fiber sensor cable, while still providing sufficient tension transfer to the device to close the trough about the hinge and cause a macro-bend in the single-mode fiber cable.

1 Claim, 3 Drawing Sheets

TENSION TRANSDUCING PASSIVE OPTICAL UTILITY POLE OVERTURNING SENSOR

BACKGROUND OF THE INVENTION

Sensing downed power lines and poles in primary voltage distribution circuits is an essential task for power safety and reliability in utility engineering. Common sensing methods include visual observation reports, and high impedance fault sensing. The former method requires observers, and the latter requires that the downed lines remain conductive at the fault location, where the abnormally high current and concomitant voltage drop results in a low impedance and resulting differential impedance boundary which travelling waves will reflect from in time domain reflectometry. If the circuit is open or the line fault location is not still highly conductive then this impedance-based fault location sensing is not possible. Advanced metering infrastructure provides the potential to ping and query smart meters at the customer secondary service location, and infer the status of the associated primary circuits, however this requires widescale deployment of smart meters and time to perform the logic-based primary circuit status inferences based on the available smart meter SCADA data.

SUMMARY OF THE INVENTION

Distributed Acoustic Sensing, or DAS, is used for remote sensing of earthquakes, and is based on the detection of backscattered light which occurs at a point of compressive force application to fiber optic waveguides, where backscatter occurs due to nano-scale strain deformation of the waveguide material which photons collide with and then deviate from a sinusoidal forward-path and travel backward. The entirety of scattered photons does not travel backward along the waveguide and the backscatter coefficient of reflection is used to estimate the total amount of scattering which occurred at a reflective event as a function of the amount of light detected, as measured in decibel signal magnitude on a trace of gain versus fiber length.

For distributed acoustic sensing, it is only necessary for some light to be reflected due to fiber waveguide material deformation, as the detection of the externally applied force at an exact distance location is the aim of DAS. For sensing pole-overturning moments and pole tension equilibrium changes due to broken conductors, an all-dielectric self-supporting, or ADSS, single-mode fiber cable connected to a line of poles using the mechanism taught by the present invention may be sufficient for DAS sensing, where an optical interrogator, comprised of a laser transmitter and Indium Gallium Arsenide or similar photodetector, would send light pulses down an ADSS fiber cable dedicated for DAS monitoring of pole loading, and monitor backscatter for signatures indicative of broken conductors and overturned poles.

It is however the aim of the present invention to provide an ideal means for placing a uniquely identifiable backscatter signature at a precise pole location for signaling pole damage which would require timely and accurate knowledge of location so that emergency restorative intervention could occur.

At 1310 and 1550 nm, a macro-bend in a single-mode optical fiber will cause a unique back-reflection signature on an optical time domain reflectometry signal trace, due to transmitted signal loss as photons migrate across the core-cladding boundary which normally constrains photon travel paths within the waveguide. The present invention provides a method to induce a macro-bend in a single-mode optical fiber in the event of a downed pole, and in this way provide an instantaneous alarm signal if a specific pole location is downed due to overturning.

A continuous single-mode optical sensing fiber connects all poles within the network of overturning-sensors, comprised of a plurality of units of the present invention. The present invention holds the fiber within a U-shaped trough which has a flexible hinge at the bottom, and connects to the pole through a mechanism which tightens the fiber-holding trough about the bottom hinge point in the event of pole movement of overturning-magnitude, which causes offset grooves within the fiber-holding sensor trough to depress in to the fiber cable, and induce a macro-bend, which becomes visible on a laser/detector signal trace interrogating the single-mode fiber sensor.

DETAILED DESCRIPTION OF THE INVENTION

Figure 1:
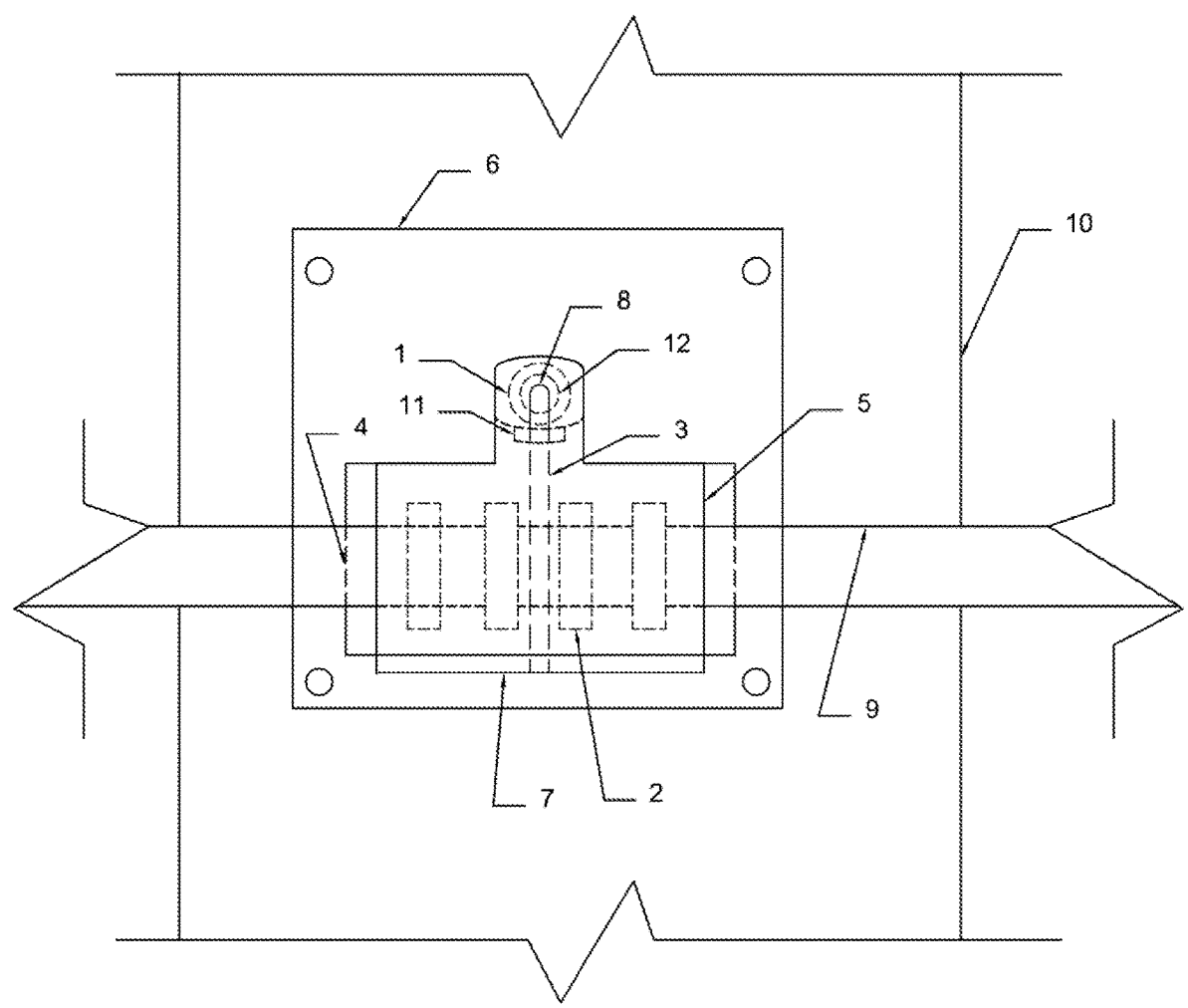
FIG. 1: A front view of the present invention, where the U-shaped trough has a pole-facing side 4, a bottom flexible hinge side 7, and a front side 5, which all have internal routing for an inelastic extension 3 which feeds through an insertion point 8 on the top of side 4 and is anchored within side 4 at a location 11 directly below insertion point 8, which effectively closes the surface comprised of edges 4,7, and 5, and holds the fiber optic sensing cable 9, and when a tension is applied to 3 at pole connection point 1 which is a plug interface which connects to the device mounting plate 6 which is affixed to the pole 10, offset grooves 2 on sides 4 and 5 depress into the fiber cable and induce a macro-bend as a result of the pole-overturning movement. The plug connection 1 is rated for a tension threshold such that the device will close about the hinge 7 and depress 2 into 9 to create a macro-bend before the device breaks away from the pole at the plug connection point 1, effectively separating from pole 10 and mounting plate 6 before the pole fully overturns, to prevent breaking the single-mode sensing fiber cable which the device retains, supports, and communicates with via pole-overturning tension induced macro-bends. 12 is a hardware braking mechanism attached to the inelastic extension 3 which sets a maximum extension point of 8 on 3 and determines a maximum opening size for the fiber-retaining trough comprising 4,5 & 7, which creates an equilibrium position for the orientation of the fiber retaining concave features 2 relative to the fiber cable 9 under normal conditions.
Figure 2:
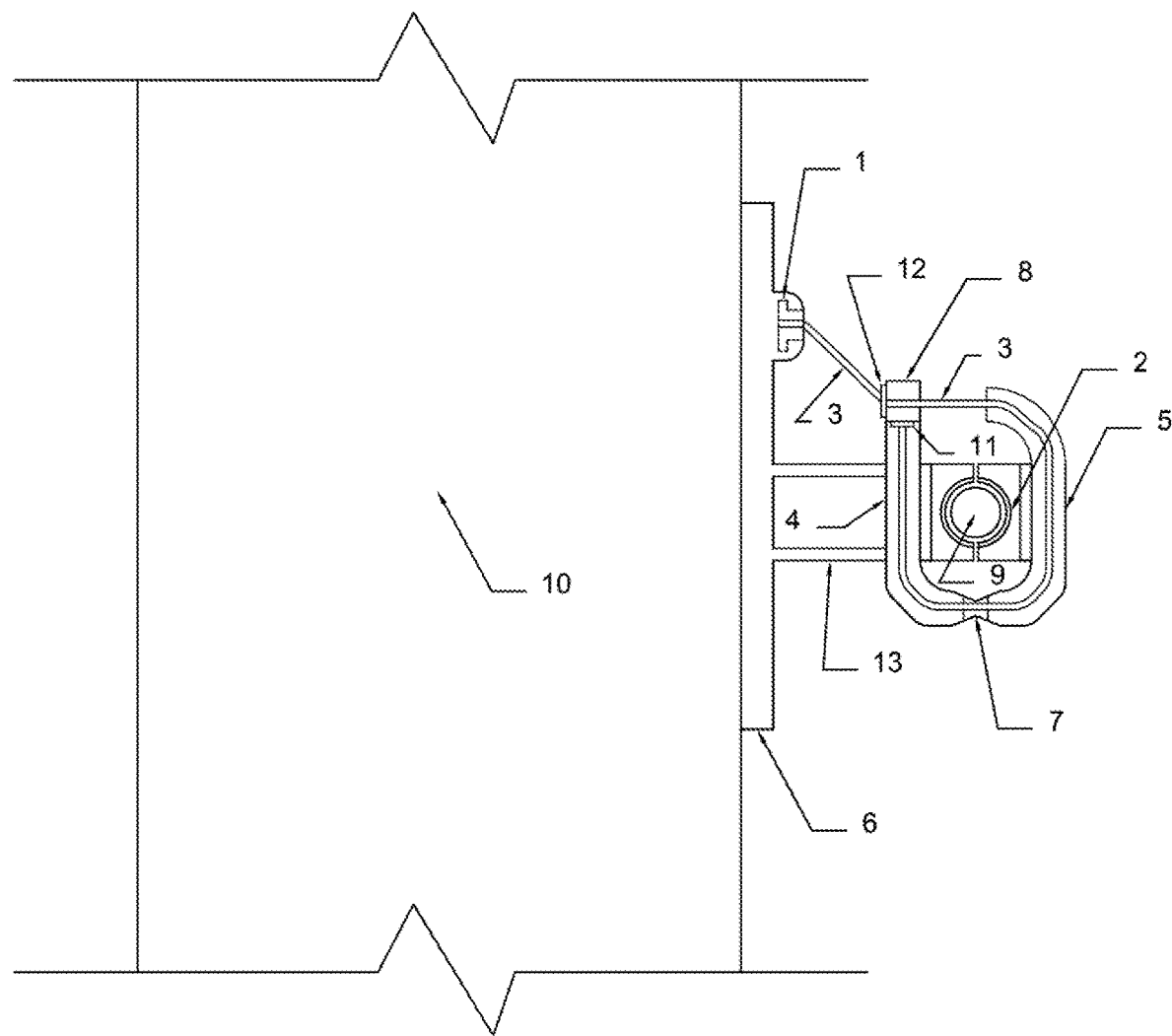
FIG. 2: A side profile view of the present invention, where the fiber-cable retaining and macro-bend inducing grooves are shown with 2 on front side 5 and back side 4, the tension-transferring extension 3 inserts through aperture 8 at the top of 4 on the back of the device, and connects to break-away plug 1 which interfaces with the pole 10 mounting plate 6. The bottom flexible hinge is shown with 7, and the fiber optic sensing cable 9 is shown retained within the structure formed by 4,7,5 and closed at the top when 3 is inserted through 8 and anchored to plug 1 on the pole mounting plate 6. Tension applied to 3 as a result of pole bending moment changes will rotate side 4 and side 5 into closer proximity about the hinge bottom location 7 which acts as a connection node between 4 and 5. Inelastic extension 3 is routed internally through 4 and 5, and is anchored directly beneath 8 to form a complete loop around the device to actuate a closing of the concave fiber retaining trough in response to tension changes resulting from pole 10 movement relative to the equilibrium position of the sensing fiber 9. Shown with 13 are perpendicular extensions from the mounting plate 6 which mechanically interface with the fiber-cable supporting features of the present device.
Figure 3:
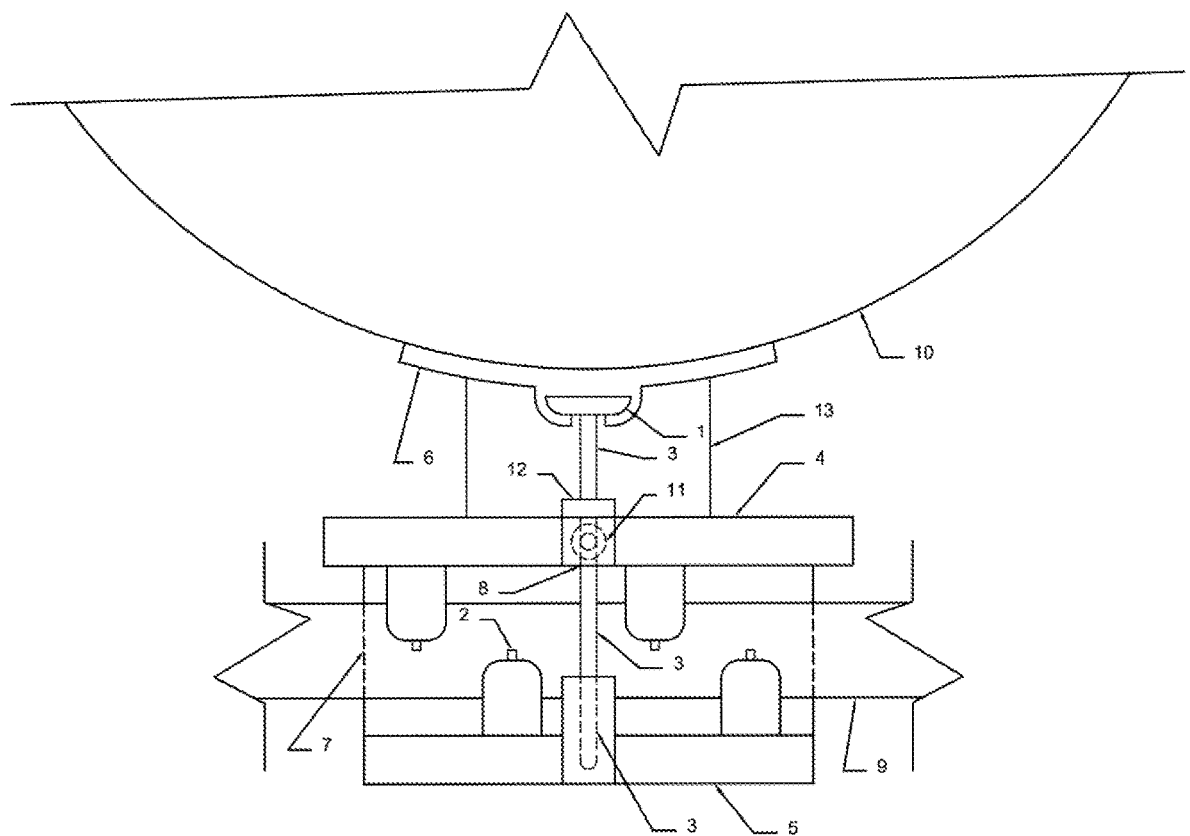
FIG. 3: A top-view of the present invention, where the offset concave grooves 2 retain the single-mode fiber sensing cable and form macro-bending moments in proportion to the tension experienced by the cable relative to the plug-in anchoring point 1,6 on pole 10. The offset fiber-retaining concave grooves 2 have protruding contact points which will further distinguish the macro-bend strain-deformation based backscatter signature, by applying pressure in a unique geometric pattern.

Proper functioning of the macro-bend inducing sensor assumes that adjacent poles are still up so that tension still exists on the single-mode fiber, such that when the pole 10 moves relative to the fiber 9, tension is applied to 3 which bends 4 and 5 closer together about hinge bottom 7 so that offset grooves 2 induce a macro-bend in to 9, while the plug connection 1 to the pole mounting plate 10 is rated to break away and disconnect above a tension threshold which would risk damage to the fiber line based on its reinforced tensile strength, to avoid breaking the single mode fiber backbone which links the sensor network comprised of the present devices. Because a movement of the pole which would precede overturning does indicate a tensioning of 3 through 8 and a bending of 5 toward 4 to cause macro-bends in 9 from pressure points at the off-set grooves 2, a permanent macro-bend exists in the fiber sensing line at this pole location, as the hinge 7 experiences a deformation due to bending which is inelastic and so remains in a macro-bending state relative to the fiber-sensing cable, so that the laser transmitter/detector interrogation system can locate and sense the macro-bend at this location on the optical time domain reflectometry signal trace.

Basic Operating Principle: Assuming there is cable tension present on the fiber sensor 9 from adjacent poles 10, a movement of 10 away from equilibrium upright axis will move the pole mounting plate 6 away from the plug connection 1 which will exert tension on protruding extension 3, which will cinch through insertion point 8, and pull the front side of the fiber trough 4 into closer contact with fiber cable 9, due to opposing tension vectors resulting from the fiber cable suspension, and the tension resulting from pole motion and transferred through the aforementioned linkages. When the front side 4 is pulled closer to 9 and the back side of the trough 5, the flexible hinge bottom 7 experiences an inelastic and permanent deformation, and the offset grooves 2 which protrude from the inner trough sides 4 and 5 are depressed into 9 and create a standing macro-bend on the single mode fiber cable 9 at this location. The plug connection 1 which connects the sensor device to the pole 10 and its mounting plate 6 is designed to fail, drop out, and break away to separate the tension transducer device from the pole 10 and the mounting plate 6 at a tension level which would exceed the tensile strength rating of the Kevlar reinforced single mode fiber cable, to prevent breaking or damaging the fiber cable, while the hinge bottom 7 is designed to inelastically bend and flex at a tension value significantly below this drop-out level, such that there is a range of tension values resulting from imminent pole 10 overturning for which tension applied to 3,4 will depress the offset grooves 2 into the fiber sensor cable and initiate a standing macro-bend, before the plug connection 1 must fail and break to prevent exceeding the tensile pull strength of the single mode fiber sensing cable 9.

The above tension transfer principle holds for the case of a pole falling away from, or a parallel to, the fiber sensor line. For the case of a pole falling into the line, it is assumed that this would down the fiber sensor line at this location, and the resultant tension change would actuate the sensors on adjacent poles, by replicating the pole-falling-away-from-line case, where opposite tension exists between the pole momentum vector and the fiber line tension where the sensor is mounted.

A laser/detector interrogator must be constantly tracing the line with pulses and monitoring backscatter events for macro-bends induced by tension-transducer actuation for this pole overturning detection scheme to be viable in practice, but this is done for intrusion-detection vibration sensing systems, such as when sensor fibers are mounted to barrier fences and bends due to vibrations and fence contact are monitored by real time laser interrogators operating on an optical time domain reflectometry principle.

The device can be constructed entirely from durable plastics, such as PVC or ABS, or flexible metal such as aluminum, or rubber, or a combination of such materials. The appropriate selection of material types to perform the disclosed functions of the components and suit the environment will be obvious to one skilled in the art of the present invention. The material strength of the components of the present invention must be sufficient to counter the weight and tension resulting from the all-dielectric self-supporting DAS cable which the present invention holds in suspension at the pole-mounting locations of the device.

The disclosed invention is only the preferred embodiment as presently understood for sensing overturned poles with macro-bends in single mode fiber continuously present along the line, and alternative embodiments which perform the same function of macro-bend optical tension-transducing are included within the disclosure of this invention.

While the present invention is designed to flex and close around the fiber cable and separate from the pole in the event of an over-turn, a phase conductor breaking and falling to the ground will result in a change in the pole loading, and the resultant force moment at the primary cross-arm will change vector orientation, as the pole-loading equilibrium is disrupted and altered by the change in tension vectors applied to the cross-arm, and it is assumed that the laser interrogator detector has sufficient sensitivity to discern the macro-bending signature which this pole bending-moment vector orientation shift would cause to the fiber line when said fiber line is retained within the structure of the device described herein.

The invention claimed is:

1. A device for sensing over-turned and downed poles in distribution power circuits, comprised of a passive optical tension transducer which creates a macro-bend signature on an optical time domain reflectometry trace when a pole to which the device is connected experiences an overturning moment, comprised of:

A flexible trough-shaped fiber cable holder, which has an inelastically hinged bottom edge, and a back side with an integrated slot at a topmost location, and a front side with a protruding extension which inserts through the integrated slot, such that the trough shaped fiber cable holder is effectively closed at the topmost location;

a plurality of protruding grooves arranged in an offset pattern, connected to an inside region of the back and front side of a trough shaped fiber cable holder, such that the protruding offset grooves are in direct contact with a reinforced fiber cable retained within the trough and maintain a cable alignment within a trough surface, and a pole mounting plate, with a plug connection point to which an endpoint of the protruding extension of the front side of the fiber trough attaches, where the plug connection provides an anchoring point to apply tension to the protruding extension and cause a bending moment of the front side of the trough about the inelastically hinged bottom edge, while said plug connection will break and detach from the pole mounting plate at a tension level which would exceed a minimum tensile strength rating of the reinforced fiber cable retained within the trough, while the inelastically hinged bottom edge of the trough is designed to bend at tension values below the tension level which would exceed the minimum tensile strength rating of the reinforced fiber cable.

* * * * *